(12) United States Patent
Wang

(10) Patent No.: US 10,651,244 B2
(45) Date of Patent: May 12, 2020

(54) TOUCH DISPLAY PANEL, METHOD FOR FABRICATING THE SAME, AND DISPLAY DEVICE

(71) Applicants: BOE Technology Group Co., Ltd., Beijing (CN); Chengdu BOE Optoelectronics Technology Co., Ltd., Chengdu, Sichuan (CN)

(72) Inventor: Yang Wang, Beijing (CN)

(73) Assignees: BOE Technology Group Co., Ltd., Beijing (CN); Chengdu BOE Optoelectronics Technology Co., Ltd., Chengdu (CN)

(*) Notice: Subject to any disclaimer, the term of this patent is extended or adjusted under 35 U.S.C. 154(b) by 17 days.

(21) Appl. No.: 16/118,826

(22) Filed: Aug. 31, 2018

(65) Prior Publication Data
US 2019/0305052 A1    Oct. 3, 2019

(30) Foreign Application Priority Data
Apr. 3, 2018  (CN) .......................... 2018 1 0289472

(51) Int. Cl.
*G06F 3/041* (2006.01)
*H01L 27/32* (2006.01)
(52) U.S. Cl.
CPC .......... *H01L 27/323* (2013.01); *G06F 3/0412* (2013.01); *G06F 2203/04103* (2013.01)

(58) Field of Classification Search
CPC . H01L 27/323; H01L 51/525; H01L 27/3276; G06F 3/0412; G06F 2203/04103; G06F 3/04164; G06F 3/047
See application file for complete search history.

(56) References Cited

U.S. PATENT DOCUMENTS

| 2011/0001723 | A1* | 1/2011 | Fan | G06F 3/0412 345/174 |
| 2017/0024075 | A1* | 1/2017 | Chiang | G06F 3/0412 |
| 2017/0329444 | A1* | 11/2017 | Hwang | G02F 1/133345 |

* cited by examiner

*Primary Examiner* — Adam R. Giesy
(74) *Attorney, Agent, or Firm* — Arent Fox LLP; Michael Fainberg

(57) ABSTRACT

Disclosed are a touch display panel, a method for fabricating the same, and a display device. Firstly first spacers are fabricated on an encapsulation cover plate, and then a pattern of touch signal lines overlying the first spacers is formed on the encapsulation cover plate, and also second spacers are formed on a substrate at positions corresponding to the first spacers, and metal lines are arranged on the second spacers to be connected with touch signal line lead lines, so that the metal lines are connected with a printed circuit board, and the touch signal lines on the first spacers come into contact with the metal lines on the second spacers while the encapsulation cover plate is being aligned with the substrate, so that the touch signal lines arranged on the encapsulation cover plate are connected with the printed circuit board arranged on the substrate.

11 Claims, 6 Drawing Sheets

--Related art--

TOUCH DISPLAY PANEL, METHOD FOR FABRICATING THE SAME, AND DISPLAY DEVICE

CROSS-REFERENCE TO RELATED APPLICATION

This application claims priority of Chinese Patent Application No. 201810289472.1, filed on Apr. 3, 2018, which is hereby incorporated by reference in its entirety.

FIELD

The present disclosure relates to the field of display panel technologies, and particularly to a touch display panel, a method for fabricating the same, and a display device.

BACKGROUND

At present, an organic light-emitting diode display screen integrated with a touch function has been widely applied to the existing advanced intelligent products. There are generally two types of touch display panels dependent upon how a touch element is integrated with a display panel. A touch display panel with a touch element fabricated on the outer surface of the display panel is referred to an on-cell touch display panel, which is less compact and has a larger thickness; and a touch display panel with a touch element fabricated directly on the inner surface of the display panel is referred to as an in-cell touch display panel, which is more compact and has a smaller thickness.

SUMMARY

An embodiment of the disclosure provides a touch display panel including a substrate, an encapsulation cover plate, and organic light-emitting elements, a printed circuit board, and organic light-emitting element lead-out lines connected with the organic light-emitting elements, the organic light-emitting elements, the printed circuit board, and the organic light-emitting element lead-out lines are arranged on a side of the substrate facing the encapsulation cover plate, wherein the organic light-emitting elements are electrically connected with the printed circuit board through the organic light-emitting element lead-out lines, wherein the touch display panel further includes:

first spacers, and touch signal lines overlying the first spacers, the first spacers, and touch signal lines are arranged on a side of the encapsulation cover plate facing the substrate in that order; and second spacers, and metal lines overlying the second spacers, the second spacers, and metal lines are arranged on the side of the substrate facing the encapsulation cover plate, wherein the metal lines are connected with the printed circuit board, and the metal lines are electrically connected with the touch signal lines overlying the first spacers.

In the touch display panel above according to some embodiments of the disclosure, the first spacers and the second spacers are mirror-symmetric on a plane parallel to the substrate.

In the touch display panel above according to some embodiments of the disclosure, the shapes of the first spacers and the second spacers are a trapeziform boss or a trapeziform stepped boss.

In the touch display panel above according to some embodiments of the disclosure, the metal lines are electrically connected with the printed circuit board through touch signal line lead lines arranged on the side of the substrate facing the encapsulation cover plate.

In the touch display panel above according to some embodiments of the disclosure, the touch signal line lead lines are arranged at a layer same as a layer on which a source-drain layer or a gate layer arranged on the substrate facing the encapsulation cover plate is arranged.

In the touch display panel above according to some embodiments of the disclosure, the metal lines are connected with the touch signal line lead lines through at least one of through-holes arranged on the side of the substrate facing the encapsulation cover plate.

In the touch display panel above according to some embodiments of the disclosure, the metal lines are connected with the touch signal line lead lines through first through-holes on a planarization layer arranged on the side of the substrate facing the encapsulation cover plate, and second through-holes on a pixel definition layer.

In the touch display panel above according to some embodiments of the disclosure, the metal lines are connected with the touch signal line lead lines through the first through-holes on the planarization layer arranged on the side of the substrate facing the encapsulation cover plate, the second through-holes on the pixel definition layer, and third through-holes on a gate insulation layer.

In the touch display panel above according to some embodiments of the disclosure, both the first spacers and the second spacers are arranged in a non-display area of the touch display panel.

Correspondingly an embodiment of the disclosure further provides a method for fabricating an OLED touch display device, the method including:

providing the encapsulation cover plate, and forming the first spacers on the side of the encapsulation cover plate facing the substrate;

forming a pattern of the touch signal lines on the encapsulation cover plate formed with the first spacers, wherein the touch signal lines overlie the first spacers;

providing the substrate, and forming the organic light-emitting elements, and the organic light-emitting element lead-out lines connected with the organic light-emitting elements, above the substrate, wherein the organic light-emitting elements are electrically connected with the printed circuit board located on the substrate through the organic light-emitting element lead-out lines;

forming the second spacers corresponding to the first spacers, and the metal lines overlying the second spacers, above the organic light-emitting elements, wherein the metal lines are electrically connected with the printed circuit board; and aligning the encapsulation cover plate with the substrate, so that the metal lines are electrically connected with the touch signal lines overlying the first spacers to form the sealed touch display panel.

Correspondingly an embodiment of the disclosure further provides an OLED touch display device including the touch display panel according to any one of the embodiments above of the disclosure.

DETAILED DESCRIPTION OF THE EMBODIMENTS

In the in-cell touch display panel in the related art, a pattern of touch signal lines is fabricated on the side of an upper encapsulation cover plate facing a substrate, and the touch signal lines are connected with a printed circuit board arranged on the side of the substrate facing the encapsulation cover plate through electrically-conductive glue, so that an organic light-emitting element and the touch signal lines share the same printed circuit board, thus reducing the number of bindings. However the touch signal lines arranged on the encapsulation cover plate are connected with the printed circuit board arranged on the substrate through the electrically-conductive glue, so that adjacent touch signal lines on the encapsulation cover plate tend to be connected in a transfer area where the electrically-conductive glue is arranged, while the electrically-conductive glue is being impressed, thus resulting interference between the adjacent touch signal lines.

Accordingly it is highly desirable for those skilled in the art to connect the touch signal lines arranged on the encapsulation cover plate with the printed circuit board arranged on the substrate, but also prevent the interference between the adjacent touch signal lines.

Figure 1:
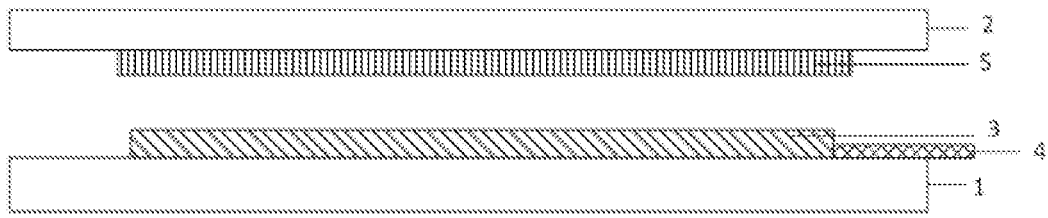
FIG. 1 is a schematic structural diagram of the in-cell touch display panel in the related art.

As illustrated in FIG. 1, the in-cell touch display panel in the related art includes a substrate 1, an encapsulation cover plate 2, an array substrate 3 located on the side of the substrate 1 facing the encapsulation cover plate 2, a pattern of touch signal lines 5 located on the side of the encapsulation cover plate 2 facing the substrate 1, and a printed circuit board 4 located on the substrate 1; and in order to enable organic light-emitting elements and the touch signal lines 5 to share the same printed circuit board 4 so as to reduce the number of bindings, the touch signal lines 5 located on the encapsulation cover plate 2 facing the substrate 1 shall be connected with the printed circuit board 4 arranged on the side of the substrate 1 facing the encapsulation cover plate 2 through electrically-conductive glue, but the touch signal lines 5 arranged on the encapsulation cover plate 2 are connected with the printed circuit board 4 arranged on the substrate 1 through the electrically-conductive glue, so that adjacent touch signal lines 5 on the encapsulation cover plate 1 tend to be connected in a transfer area where the electrically-conductive glue is arranged, while the electrically-conductive glue is being impressed, thus resulting interference between the adjacent touch signal lines.

In view of the problem above in the touch display panel in the related art, embodiments of the disclosure provide a touch display panel, a method for fabricating the same, and a display device. In order to make the objects, technical solutions, and advantages of the disclosure more apparent, the disclosure will be described below in further details with reference to the drawings, and apparently the embodiments described below are only a part but not all of the embodiments of the disclosure. Based upon the embodiments here of the disclosure, all the other embodiments which can occur to those skilled in the art without any inventive effort shall fall into the scope of the disclosure.

The shapes and sizes of respective components in the drawings are not intended to reflect any real proportion, but only intended to illustrate the disclosure of the disclosure.

Figure 2:
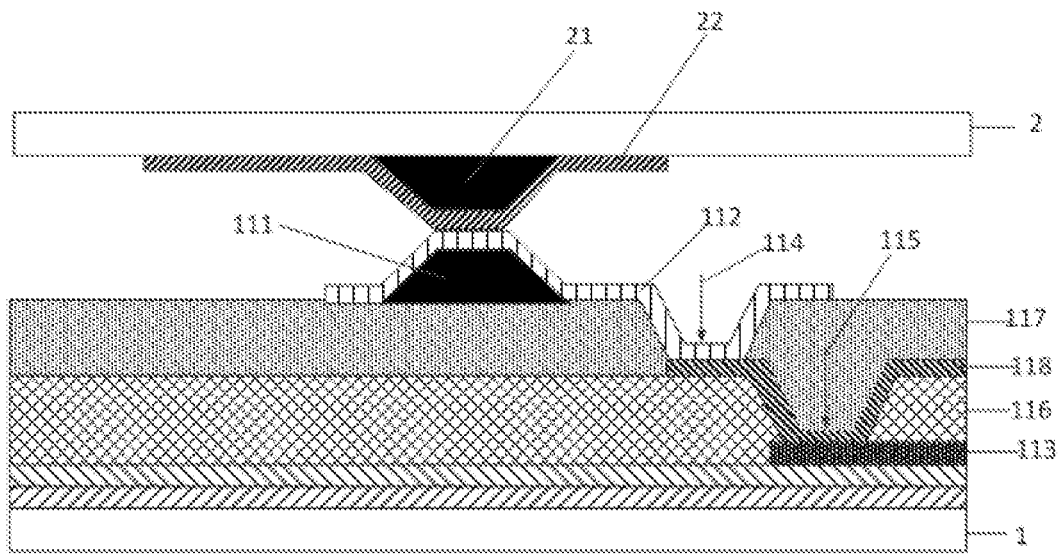
FIG. 2 is a first schematic structural diagram of a touch display panel according to an embodiment of the disclosure.

As illustrated in FIG. 2, an embodiment of the disclosure provides a touch display panel including a substrate 1, an encapsulation cover plate 2, and organic light-emitting elements, a printed circuit board, and organic light-emitting element lead-out lines connected with the organic light-emitting elements, arranged on the side of the substrate 1 facing the encapsulation cover plate 2, where the organic light-emitting elements are electrically connected with the printed circuit board through the organic light-emitting element lead-out lines, where the touch display panel further includes followings.

First spacers 21, and touch signal lines 22 overlying the first spacers 21, arranged on the side of the encapsulation cover plate 2 facing the substrate 1 in that order, and second spacers 111, and metal lines 112 overlying the second spacers 111, arranged on the side of the substrate 1 facing the encapsulation cover plate 2, where the metal lines 112 are connected with the printed circuit board, and the metal lines 112 are electrically connected with the touch signal lines 22 overlying the first spacers 21.

The embodiment of the disclosure provides a touch display panel including a substrate, an encapsulation cover plate, and organic light-emitting elements, a printed circuit board, and organic light-emitting element lead-out lines connected with the organic light-emitting elements, arranged on the side of the substrate facing the encapsulation cover plate, where the organic light-emitting elements are electrically connected with the printed circuit board through the organic light-emitting element lead-out lines, where the touch display panel further includes: first spacers, and touch signal lines overlying the first spacers, arranged on the side of the encapsulation cover plate facing the substrate in that order; and second spacers, and metal lines overlying the second spacers, arranged on the side of the substrate facing the encapsulation cover plate, where the metal lines are connected with the printed circuit board, and the metal lines are electrically connected with the touch signal lines overlying the first spacers. Firstly the first spacers are fabricated in a transfer area on the encapsulation cover plate, and then a pattern of the touch signal lines overlying the first spacers is formed on the encapsulation cover plate, and also the second spacers are formed on the substrate at positions corresponding to the first spacers, and the metal lines are arranged on the second spacers to be connected with the touch signal line lead lines, so that the metal lines are connected with the printed circuit board, and the touch signal lines on the first spacers come into contact with the metal lines on the second spacers while the encapsulation cover plate is being aligned with the substrate, so that the touch signal lines arranged on the encapsulation cover plate are connected with the printed circuit board arranged on the substrate. Since there is a preset distance between the first spacers fabricated on the encapsulation cover plate, the respective touch signal lines on the encapsulation cover plate will not be connected while the encapsulation cover plate is being aligned with the substrate, to thereby prevent signal interference between the respective touch signal lines.

It shall be noted that in the touch display panel above according to the embodiment of the disclosure, both the first spacers and the second spacers are arranged in a non-display area of the touch display panel so as not to affect an opening ratio of the display panel, and the touch signal lines on the first spacers come into contact with the metal lines on the second spacers after the encapsulation cover plate is aligned with the substrate, so that the touch signal lines arranged on the encapsulation cover plate are connected with the printed circuit board arranged on the substrate, and thus a touch signal can be transmitted normally to the printed circuit board.

Optionally, in the touch display panel above according to the embodiment of the disclosure, as illustrated in FIG. 2, the first spacers 21 and the second spacers 111 are mirror-symmetric on a plane parallel to the substrate 1.

In the touch display panel above according to some embodiments of the disclosure, the first spacers and the second spacers are mirror-symmetric on the plane parallel to the substrate, so that the areas of the surfaces of the first spacers on the sides thereof facing the substrate can be equal to the areas of the surfaces of the second spacers on the sides thereof facing the encapsulation cover plate, and the touch signal lines arranged on the first spacers can come into contact with the metal lines arranged on the second spacers as much as possible while the substrate is being aligned with the encapsulation cover plate to thereby better transmit a signal.

Optionally, in the touch display panel above according to the embodiment of the disclosure, the shapes of the first spacers and the second spacers are a trapeziform boss or a trapeziform stepped boss.

Figure 3:
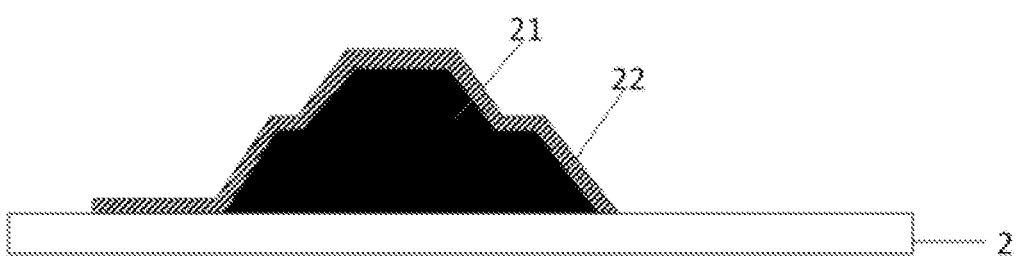
FIG. 3 is a schematic structural diagram of a first spacer in a touch display panel according to an embodiment of the disclosure.

In the touch display panel above according to some embodiments of the disclosure, as illustrated in FIG. 2, the shapes of the first spacers 21 and the second spacers 11 can be set to a trapeziform boss, where the trapeziform boss has such a slope that a touch signal line or a metal line deposited thereon can climb up the slope; or as illustrated in FIG. 3, the shapes of the first spacers 21 and the second spacers 111 can be set to a trapeziform stepped boss, where the trapeziform stepped boss has such a buffer platform as compared with the middle of the trapeziform boss that a metal line can climb up the slope more easily so as not to be broken.

Optionally, in the touch display panel above according to some embodiments of the disclosure, the metal lines are electrically connected with the printed circuit board through the lead-out lines, of the touch signal lines, which are arranged on the side of the substrate facing the encapsulation cover plate, where the touch signal line lead lines can be arranged at the same layer as the metal lines, or can be arranged at a different layer from the metal lines, although the embodiment of the disclosure will not be limited thereto.

Optionally, in the touch display panel above according to some embodiments of the disclosure, the touch signal line lead lines are arranged at the same layer as the metal layer arranged on the side of the substrate facing the encapsulation cover plate.

In the touch display panel above according to some embodiments of the disclosure, since the touch signal line lead lines are made of a metal material, a pattern of the touch signal line lead lines shall be formed by patterning the metal layer, so the touch signal line lead lines are arranged at the same layer as the metal layer on the substrate, so that a pattern for patterning the metal layer, and the pattern of the touch signal line lead lines can be formed using a mask to thereby reduce the thickness of the touch display panel.

Optionally, in the touch display panel above according to some embodiments of the disclosure, the touch signal line lead lines are arranged at the same layer as a source-drain layer or a gate layer arranged on the side of the substrate facing the encapsulation cover plate.

In the touch display panel above according to some embodiments of the disclosure, the touch signal line lead lines can be arranged at the same layer as the sources and the drains arranged on the substrate, and the pattern of the lead-out lines of the touch signal can be formed while a pattern of the sources and the drains is formed using a mask for forming the sources and the drains; the touch signal line lead lines can be arranged at the same layer as the gate layer arranged on the substrate, and the pattern of the lead-out lines of the touch signal can be formed while a pattern of the gates is formed using a mask for forming the gates. In this way, the touch signal line lead lines are formed so that the thickness of the touch display panel can be reduced, but also a fabrication process can be omitted to thereby save a production cost. Of course, only the touch signal line lead lines arranged at the same layer as the sources and the drains, or the gates as illustrated in the embodiment above, but the touch signal line lead lines can alternatively be an electrically-conductive structure made of other than a metal material, so the touch signal line lead lines can alternatively be arranged at the same layer as an electrically-conductive structure made of other than a metal material, e.g., a cathode layer, an anode layer, etc., particularly dependent upon a real application condition, although the embodiment of the disclosure will not be limited thereto.

Optionally, in the touch display panel above according to some embodiments of the disclosure, the metal lines are connected with the touch signal line lead lines through at least one through-holes arranged on the side of the substrate facing the encapsulation cover plate.

In the touch display panel above according to some embodiments of the disclosure, since there is some distance between the layer including the metal lines, and the printed circuit board, the touch signal line lead lines are arranged at the same layer as the metal lines, and the touch signal line lead lines are further connected with the printed circuit board, the metal lines tend to be broken, so that a touch signal cannot be transmitted smoothly. Accordingly the metal lines shall be connected with the touch signal line lead lines through at least one through-holes, and further connected with the printed circuit board through the touch signal line lead lines to thereby lower the risk of being broken.

Optionally, in the touch display panel above according to some embodiments of the disclosure, as illustrated in FIG. 2, the metal lines 112 are connected with the touch signal line lead lines 113 through first through-holes 115 on a planarization layer 116 arranged on the side of the substrate 1 facing the encapsulation cover plate 2, and second through-holes 114 on a pixel definition layer 117.

In the touch display panel above according to some embodiments of the disclosure, when the touch signal line lead lines are arranged at the same layer as the source-drain layer, the metal lines shall be connected with the touch signal line lead lines through the first through-holes arranged on the planarization layer, and the second through-holes arranged on the pixel definition layer, and further connected with the printed circuit board through the touch signal line lead lines to thereby lower the risk of being broken.

Figure 4:
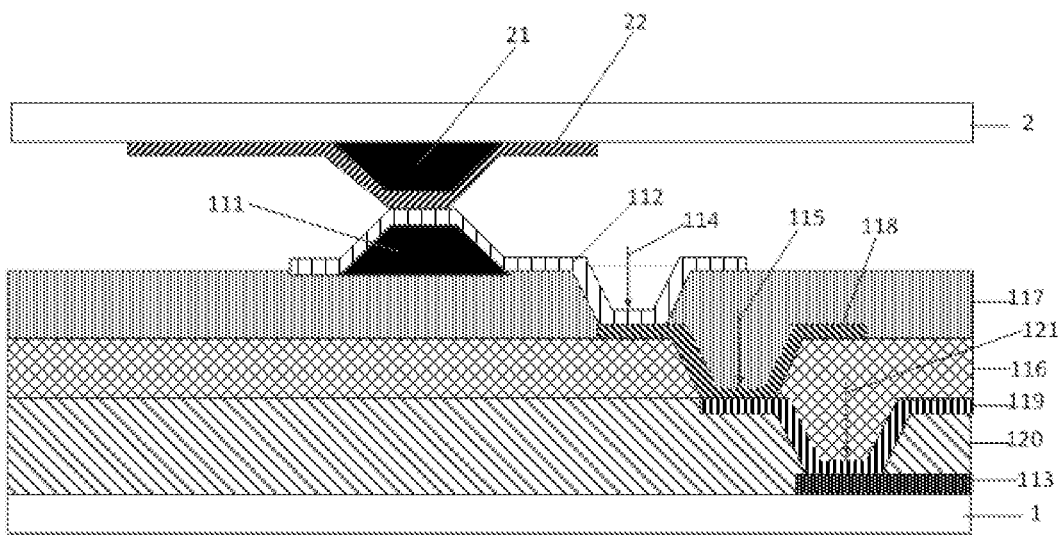
FIG. 4 is a second schematic structural diagram of a touch display panel according to an embodiment of the disclosure.

Optionally, in the touch display panel above according to some embodiments of the disclosure, as illustrated in FIG. 4, the metal lines 112 are connected with the touch signal line lead lines 113 through first through-holes 115 on a planarization layer 116 arranged on the side of the substrate 1 facing the encapsulation cover plate 2, second through-holes 114 on a pixel definition layer 117, and third through-holes 121 on a gate insulation layer 120.

In the touch display panel above according to some embodiments of the disclosure, as illustrated in FIG. 4, when the touch signal line lead lines 113 are arranged at the same layer as the gate layer, the metal lines 112 shall be connected with the touch signal line lead lines 113 through the first through-holes 115 arranged on the planarization layer 116, the second through-holes 114 arranged on the pixel definition layer 117, and transfer lines 119, at the same layer as the sources and the drains, deposited in the third through-holes 121 on the gate insulation layer 120, and further connected with the printed circuit board through the touch signal line lead lines 113 to thereby lower the risk of being broken.

Optionally, in the touch display panel above according to some embodiments of the disclosure, both the substrate and the encapsulation cover plate are transparent glass substrates.

A method for fabricating a touch display panel according to an embodiment of the disclosure will be described below taking the touch display panel as illustrated in FIG. 2 as an example, and particularly the fabricating method includes the following steps.

Figure 5A:
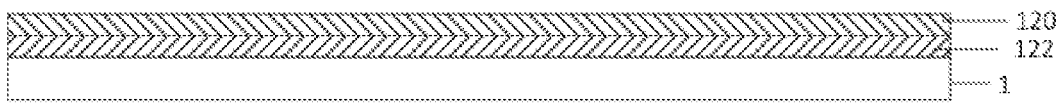
FIG. 5A to FIG. 5I are schematic structural diagrams of a process of fabricating a structure located on the side of a substrate facing an encapsulation cover plate in a touch display panel according to an embodiment of the disclosure.

(1) Patterns of a gate layer 122 and the gate insulation layer 120 are formed on the substrate 1 (a particular pattern of the gate layer is not illustrated) as illustrated in FIG. 5A.

Figure 5B:
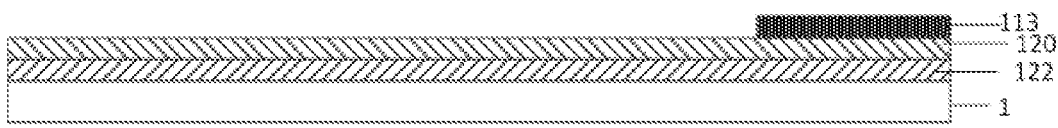

(2) The pattern of the touch signal line lead lines 113, and the pattern of the sources and the drains are formed on the gate insulation layer 120 (the pattern of the sources and the drains are not illustrated) as illustrated in FIG. 5B.

Figure 5C:
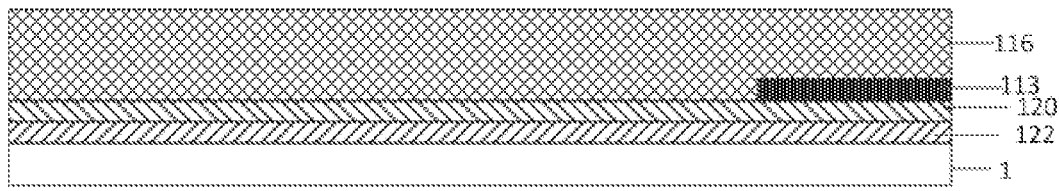

(3) The planarization layer 116 is formed on the pattern of the touch signal line lead lines 113 as illustrated in FIG. 5C.

Figure 5D:
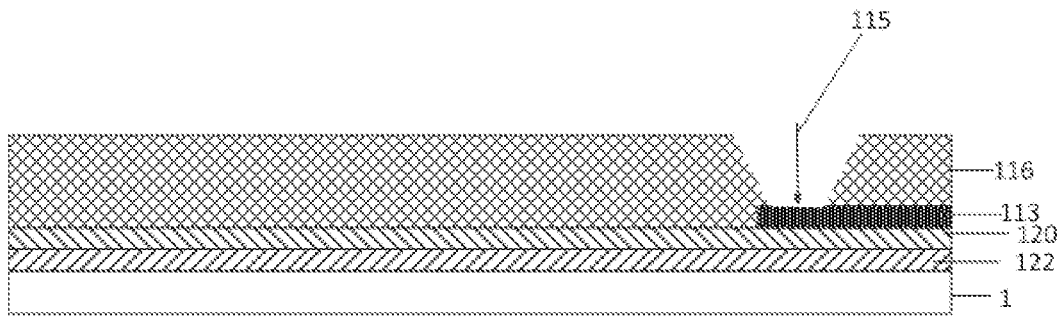

(4) The first through-holes 115 are formed at the planarization layer 116 at positions corresponding to the touch signal line lead lines 113 using a mask as illustrated in FIG. 5D.

Figure 5E:
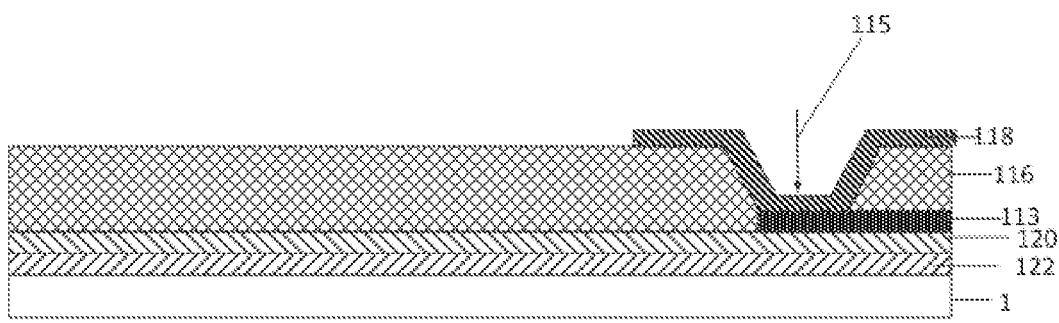

(5) The anode layer is formed on the planarization layer 116, and the anode layer (not illustrated) and the transfer lines 119 are patterned using the same mask as illustrated in FIG. 5E.

Figure 5F:
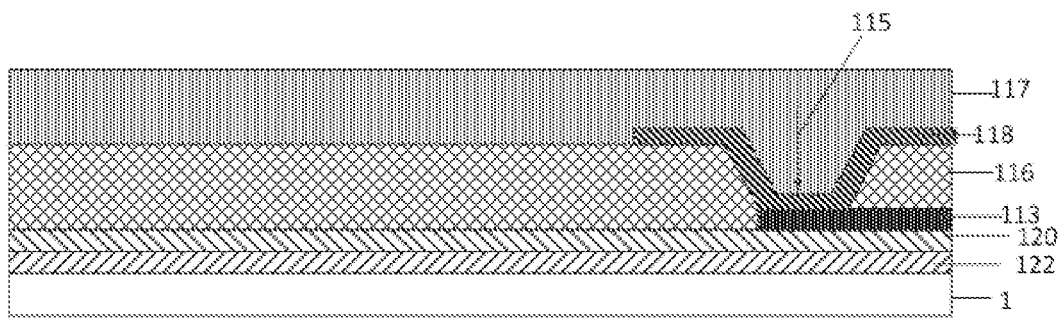

(6) The pixel definition layer 117 is formed on the anode layer as illustrated in FIG. 5F.

Figure 5G:
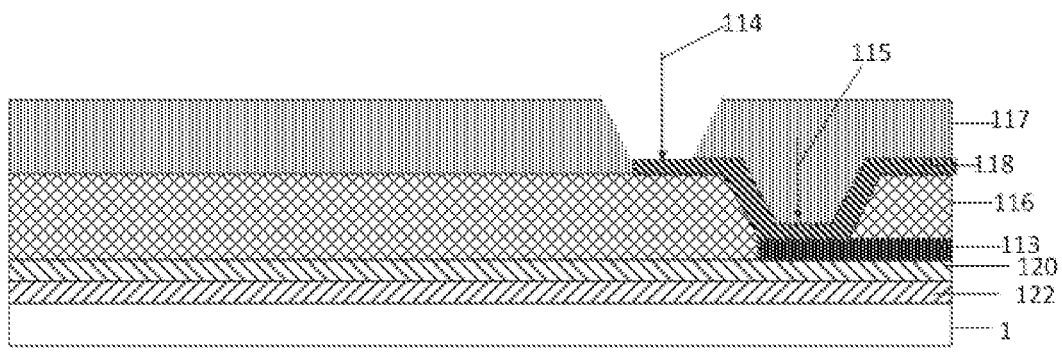

(7) The second through-holes 114 are formed at the pixel definition layer 117 at positions corresponding to the transfer lines 119 using a mask as illustrated in FIG. 5G.

Figure 5H:
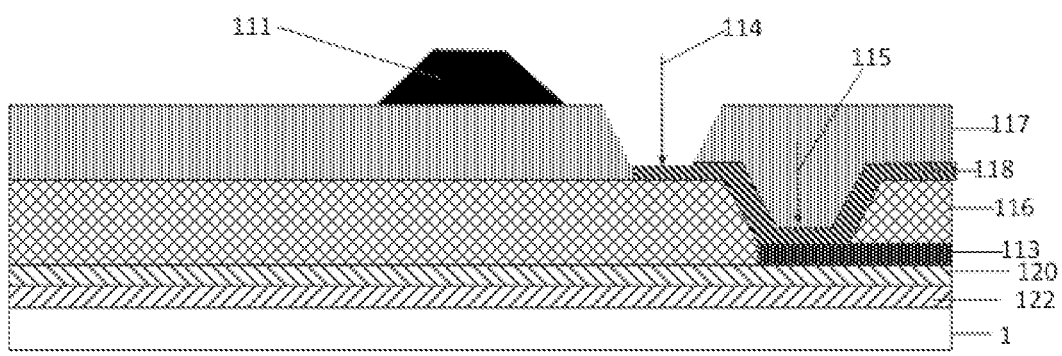

(8) A pattern of the second spacers 111 is formed on the pixel definition layer 117 in the transfer area as illustrated in FIG. 5H.

Figure 5I:
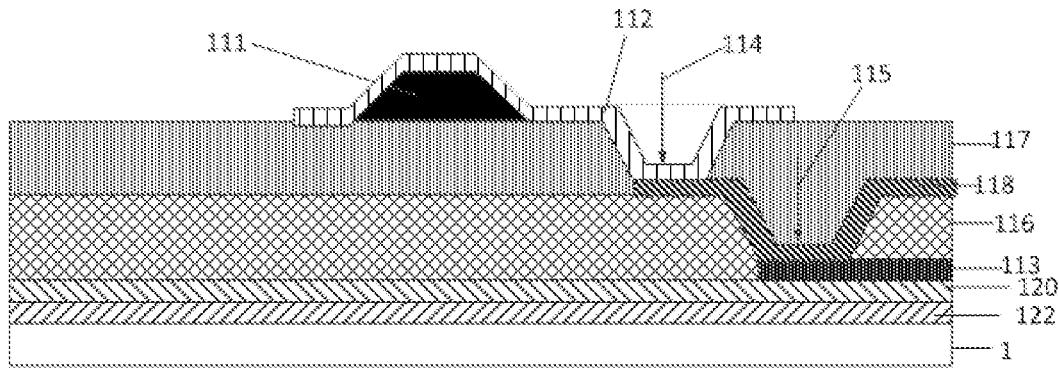

(9) A pattern of the metal lines 112 is formed on the second spacers 111 as illustrated in FIG. 5I.

Figure 6A:
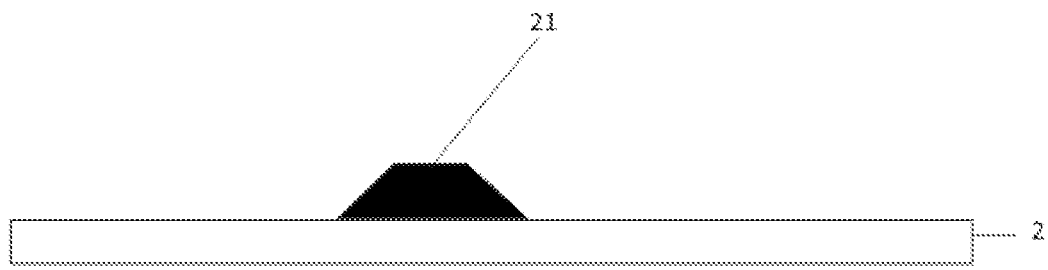
FIG. 6A and FIG. 6B are schematic structural diagrams of a process of fabricating a structure located on the side of an encapsulation cover plate facing a substrate in a touch display panel according to an embodiment of the disclosure.

(10) A pattern of the first spacers 21 is formed on the side of the encapsulation cover plate 2 facing the substrate 1 as illustrated in FIG. 6A.

Figure 6B:
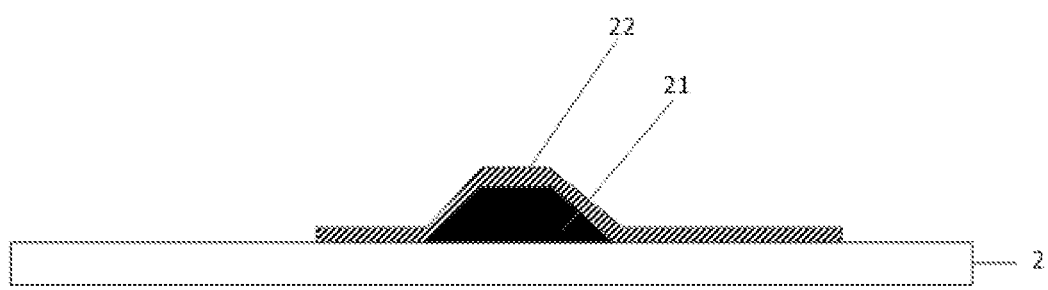

(11) A pattern of the touch signal lines 22 is formed on the pattern of the first spacers 21, where the pattern of the touch signal lines 22 overlies the first spacers 21, as illustrated in FIG. 6B.

(12) The fabricated substrate is aligned with the fabricated encapsulation cover plate to form the touch display panel, as illustrated in FIG. 2.

It shall be noted that the steps (1) to (9) are the steps of fabricating the patterns on the side of the substrate facing the encapsulation cover plate, and the steps (10) and (11) are the steps of fabricating the patterns on the side of the encapsulation cover plate facing the substrate, so the steps (1) to (9) may be performed before or after or parallel to the steps (10) and (11).

Figure 7:
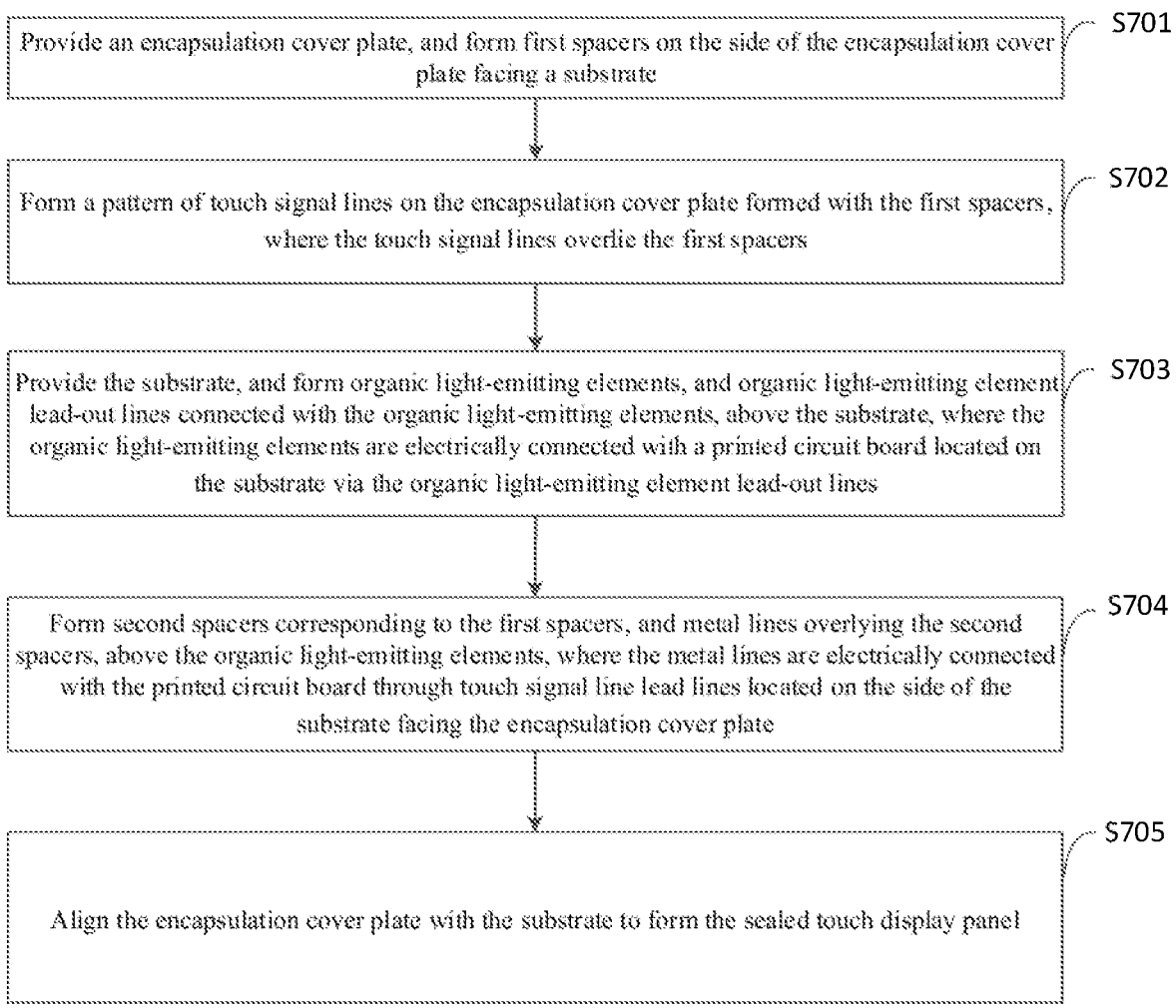
FIG. 7 is a schematic flow chart of a method for fabricating a touch display panel according to an embodiment of the disclosure.

Based upon the same inventive idea, referring to FIG. 7, an embodiment of the disclosure further provides a method for fabricating a touch display panel, where the method includes the following steps.

S701 is to provide an encapsulation cover plate, and to form first spacers on the side of the encapsulation cover plate facing a substrate.

S702 is to form a pattern of touch signal lines on the encapsulation cover plate formed with the first spacers, where the touch signal lines overlie the first spacers.

S703 is to provide the substrate, and to form organic light-emitting elements, and organic light-emitting element lead-out lines connected with the organic light-emitting elements, above the substrate, where the organic light-emitting elements are electrically connected with a printed circuit board located on the substrate through the organic light-emitting element lead-out lines.

S704 is to form second spacers corresponding to the first spacers, and metal lines overlying the second spacers, above the organic light-emitting elements, where the metal lines are electrically connected with the printed circuit board.

S705 is to align the encapsulation cover plate with the substrate, so that the metal lines are electrically connected with the touch signal lines overlying the first spacers to form the sealed touch display panel.

Optionally, in the method above for fabricating a touch display panel according to some embodiments of the disclosure, the method further includes followings.

Forming at least one through-holes between the metal lines and touch signal line lead lines so that the metal lines are connected with the touch signal line lead lines.

The structures of the respective layers in the touch display panel are formed in the steps above in a patterning process. The patterning process can include only a photo-lithography process, or can include a photo-lithography process and an etching step, and also printing, ink-jetting, or other processes for forming a predetermined pattern; and the photo-lithography process refers to a process for forming a pattern using photo-resist, a mask, an exposure machine, etc., in film formation, exposure, development, and other processes. In an implementation, a corresponding patterning process can be selected for a structure to be formed in the embodiment of the disclosure.

In the method above for fabricating a touch display panel, the same structures are formed, and the same advantageous effects are achieved, as the touch display panel above in the steps of the process of fabricating the touch display panel in the embodiment above, so a repeated description thereof will be omitted here.

Based upon the same inventive idea, an embodiment of the disclosure further provides a display device including the touch display panel above according to the embodiment of the disclosure. Since the display device addresses the problem under a similar principle to the touch display panel above, reference can be made to the implementation of the touch display panel above for an implementation of the display device, and a repeated description thereof will be omitted here.

Here the display device is applicable to an organic light-emitting diode display, an inorganic light-emitting diode display, an Active Matrix Organic Light-Emitting Diode (AMOLED) display, etc. The display device can be a mobile phone, a tablet computer, a TV set, a monitor, a notebook computer, a digital photo frame, a navigator, or any other product or component with a display function, although the embodiment of the disclosure will not be limited thereto.

The embodiments of the disclosure provides a touch display panel, a method for fabricating the same, and a display device, and the touch display panel includes a substrate, an encapsulation cover plate, and organic light-emitting elements, a printed circuit board, and organic light-emitting element lead-out lines connected with the organic light-emitting elements, arranged on the side of the substrate facing the encapsulation cover plate, where the organic light-emitting elements are electrically connected with the printed circuit board through the organic light-emitting element lead-out lines, where the touch display panel further includes: first spacers, and touch signal lines overlying the first spacers, arranged on the side of the encapsulation cover plate facing the substrate in that order; and second spacers, and metal lines overlying the second spacers, arranged on the side of the substrate facing the encapsulation cover plate, where the metal lines are connected with the printed circuit board, and the metal lines are electrically connected with the touch signal lines overlying the first spacers. Firstly the first spacers are fabricated in a transfer area on the encapsulation cover plate, and then a pattern of the touch signal lines overlying the first spacers is formed on the encapsulation cover plate, and also the second spacers are formed on the substrate at positions corresponding to the first spacers, and the metal lines are arranged on the second spacers to be connected with the touch signal line lead lines, so that the metal lines are connected with the printed circuit board, and the touch signal lines on the first spacers come into contact with the metal lines on the second spacers while the encapsulation cover plate is being aligned with the substrate, so that the touch signal lines arranged on the encapsulation cover plate are connected with the printed circuit board arranged on the substrate. Since there is a preset distance between the first spacers fabricated on the encapsulation cover plate, the respective touch signal lines on the encapsulation cover plate will not be connected while the encapsulation cover plate is being aligned with the substrate, to thereby prevent signal interference between the respective touch signal lines.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

The invention claimed is:

1. A touch display panel, comprising a substrate, an encapsulation cover plate, and organic light-emitting elements, a printed circuit board, and organic light-emitting element lead-out lines connected with the organic light-emitting elements, the organic light-emitting elements, the printed circuit board, and the organic light-emitting element lead-out lines are arranged on a side of the substrate facing the encapsulation cover plate, wherein the organic light-emitting elements are electrically connected with the printed circuit board through the organic light-emitting element lead-out lines, wherein the touch display panel further comprises:

first spacers, and touch signal lines overlying the first spacers, the first spacers and touch signal lines are arranged successively on a side of the encapsulation cover plate facing the substrate; and second spacers corresponding to the first spacers, and metal lines overlying the second spacers, the second spacers and metal lines are arranged on the side of the substrate facing the encapsulation cover plate, wherein the metal lines are connected with the printed circuit board, and the metal lines are electrically connected with the touch signal lines overlying the first spacers.

2. The touch display panel according to claim 1, wherein the first spacers and the second spacers are mirror-symmetric on a plane parallel to the substrate.

3. The touch display panel according to claim 2, wherein the shapes of the first spacers and the second spacers are a trapeziform boss or a trapeziform stepped boss.

4. The touch display panel according to claim 1, wherein the metal lines are electrically connected with the printed circuit board through touch signal line lead lines arranged on the side of the substrate facing the encapsulation cover plate.

5. The touch display panel according to claim 4, wherein the touch signal line lead lines are arranged at layer same as a layer on which a source-drain layer or a gate layer arranged on the substrate facing the encapsulation cover plate is arranged.

6. The touch display panel according to claim 4, wherein the metal lines are connected with the touch signal line lead lines through at least one of through-holes arranged on the side of the substrate facing the encapsulation cover plate.

7. The touch display panel according to claim 4, wherein the metal lines are connected with the touch signal line lead lines through first through-holes on a planarization layer arranged on the side of the substrate facing the encapsulation cover plate, and second through-holes on a pixel definition layer.

8. The touch display panel according to claim 4, wherein the metal lines are connected with the touch signal line lead lines through the first through-holes on the planarization layer arranged on the side of the substrate facing the encapsulation cover plate, the second through-holes on the pixel definition layer, and third through-holes on a gate insulation layer.

9. The touch display panel according to claim 1, wherein both the first spacers and the second spacers are arranged in a non-display area of the touch display panel.

10. A method for fabricating the touch display panel according to claim 1, the method comprising:

providing the encapsulation cover plate, and forming the first spacers on the side of the encapsulation cover plate facing the substrate;

forming a pattern of the touch signal lines on the encapsulation cover plate formed with the first spacers, wherein the touch signal lines overlie the first spacers;

providing the substrate, and forming the organic light-emitting elements, and the organic light-emitting element lead-out lines connected with the organic light-emitting elements, above the substrate, wherein the organic light-emitting elements are electrically connected with the printed circuit board located on the substrate through the organic light-emitting element lead-out lines;

forming the second spacers corresponding to the first spacers, and the metal lines overlying the second spacers, above the organic light-emitting elements, wherein the metal lines are electrically connected with the printed circuit board; and aligning the encapsulation cover plate with the substrate, so that the metal lines are electrically connected with the touch signal lines overlying the first spacers to form the sealed touch display panel.

11. A display device, comprising the touch display panel according to claim 1.

* * * * *